United States Patent
Kurata

(10) Patent No.: US 11,309,236 B2
(45) Date of Patent: Apr. 19, 2022

(54) SEMICONDUCTOR DEVICE

(71) Applicant: KIOXIA CORPORATION, Tokyo (JP)

(72) Inventor: Minoru Kurata, Shinagawa Tokyo (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/805,340

(22) Filed: Feb. 28, 2020

(65) Prior Publication Data

US 2021/0074619 A1 Mar. 11, 2021

(30) Foreign Application Priority Data

Sep. 10, 2019 (JP) .............................. JP2019-164909

(51) Int. Cl.
| | |
|---|---|
| *H01L 23/498* | (2006.01) |
| *H01L 23/00* | (2006.01) |
| *H01L 25/18* | (2006.01) |
| *H01L 25/00* | (2006.01) |

(52) U.S. Cl.
CPC ........ *H01L 23/49833* (2013.01); *H01L 24/48* (2013.01); *H01L 24/49* (2013.01); *H01L 25/18* (2013.01); *H01L 25/50* (2013.01); *H01L 2224/48091* (2013.01); *H01L 2224/48225* (2013.01); *H01L 2224/49176* (2013.01)

(58) Field of Classification Search
CPC ....................... H01L 25/0657; H01L 23/79833
See application file for complete search history.

(56) References Cited

U.S. PATENT DOCUMENTS

| | | | |
|---|---|---|---|
| 8,399,305 B2 | 3/2013 | Huang et al. | |
| 8,693,211 B2 | 4/2014 | Tamadate | |
| 9,418,974 B2 * | 8/2016 | Ng ......................... | H01L 24/85 |
| 2003/0038374 A1 | 2/2003 | Shim et al. | |
| 2006/0113679 A1 | 6/2006 | Takatsu et al. | |
| 2008/0173995 A1 | 7/2008 | Kuratomi et al. | |
| 2013/0049228 A1 | 2/2013 | Nam et al. | |
| 2019/0088623 A1 | 3/2019 | Matsumoto et al. | |

FOREIGN PATENT DOCUMENTS

| | | |
|---|---|---|
| JP | H0637211 A | 2/1994 |
| JP | 2009177061 A | 8/2009 |
| JP | 2019054181 A | 4/2019 |
| TW | 200623391 A | 7/2006 |
| TW | 200822301 A | 5/2008 |
| TW | 201603211 A | 1/2016 |

* cited by examiner

*Primary Examiner* — Yu-Hsi D Sun
(74) *Attorney, Agent, or Firm* — Kim & Stewart LLP

(57) ABSTRACT

A semiconductor device includes a pair of spacers disposed on the surface of a substrate, the spacers are a first height and spaced from each other at a first distance along a first direction. A first semiconductor chip is mounted on the substrate surface. The first semiconductor chip has a second height that is less than the first height. The first semiconductor chip can be connected to the substrate with bonding wires or the like. A second semiconductor chip is mounted on the spacers and spans the distance between the spacers. The second semiconductor chip is above at least a portion of the first semiconductor chip. A projecting section is provided on the surface of the substrate between the spacers in the first direction. The projecting section is between the first semiconductor chip and an outer edge of the substrate and protrudes upward from the surface of the substrate.

21 Claims, 6 Drawing Sheets

SEMICONDUCTOR DEVICE

CROSS-REFERENCE TO RELATED APPLICATION

This application is based upon and claims the benefit of priority from Japanese Patent Application No. 2019-164909, filed Sep. 10, 2019, the entire contents of which are incorporated herein by reference.

FIELD

Embodiments described herein relate generally to a semiconductor device.

BACKGROUND

After semiconductor chips are mounted to a substrate, the assembly is subjected to a molding process to encapsulate the semiconductor chips in a resin. If a void is left in the resulting semiconductor package due to insufficient filling of the resin, then there is a fear that a defect, such as a crack, may form in the semiconductor package.

DETAILED DESCRIPTION

At least one embodiment of the present disclosure provides a semiconductor device which is less likely to have a void in its encapsulating resin due to insufficient filling of the resin during packaging.

In general, according to one embodiment, a semiconductor device comprises a first pair of spacers on a surface of a substrate. The spacers of the first pair have a first height and are spaced from each other by a first distance along a first direction. A first semiconductor chip is on the surface between the first pair of spacers in the first direction. The first semiconductor chip has a second height, less than the first height, and is connected to the substrate. A second semiconductor chip is mounted on the first pair of spacers and spans the first distance between the first pair of spacers. The second semiconductor chip is above the first semiconductor chip. A projecting section (also referred to as projecting portion or protruding section) is disposed on the surface of the substrate between the first pair of spacers in the first direction. The projecting section is between the first semiconductor chip and an outer edge of the substrate and protrudes upward from the surface to a third height.

In general, according to another embodiment, a semiconductor device includes a substrate, a first semiconductor chip mounted on the substrate and electrically connected to the substrate by a plurality of bonding wires, a second semiconductor chip mounted on a plurality of spacers provided on the substrate so that it is located at a distance from the first semiconductor chip, and a projecting section provided between two adjacent spacers of the plurality of spacers such that it projects upward from the substrate.

Certain example embodiments of the present disclosure will now be described with reference to the drawings. It should be noted that, in general, the drawings are schematic. Thus, the depicted relationship(s) between the thickness and other dimensions of a component or element, the ratio of dimensions between components or elements and the like are not necessarily to scale. In different drawings, the same component(s) or element(s) may be depicted with different sizes and/or at different dimensional ratios.

Device Structure

Figure 1:
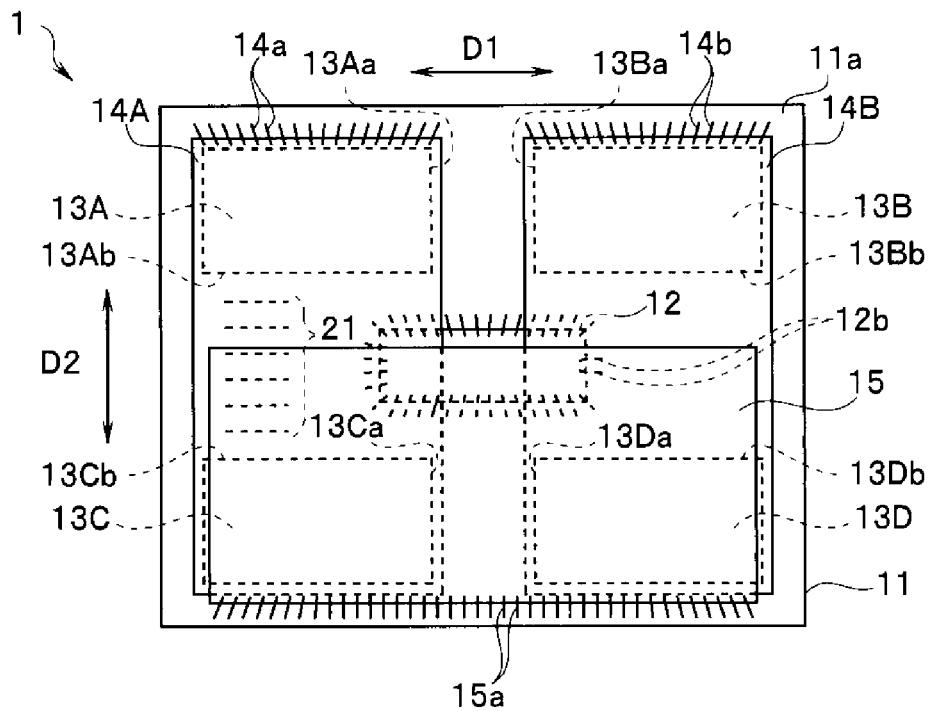
FIG. 1 is a plan view of a semiconductor device according to one example embodiment.
Figure 2:
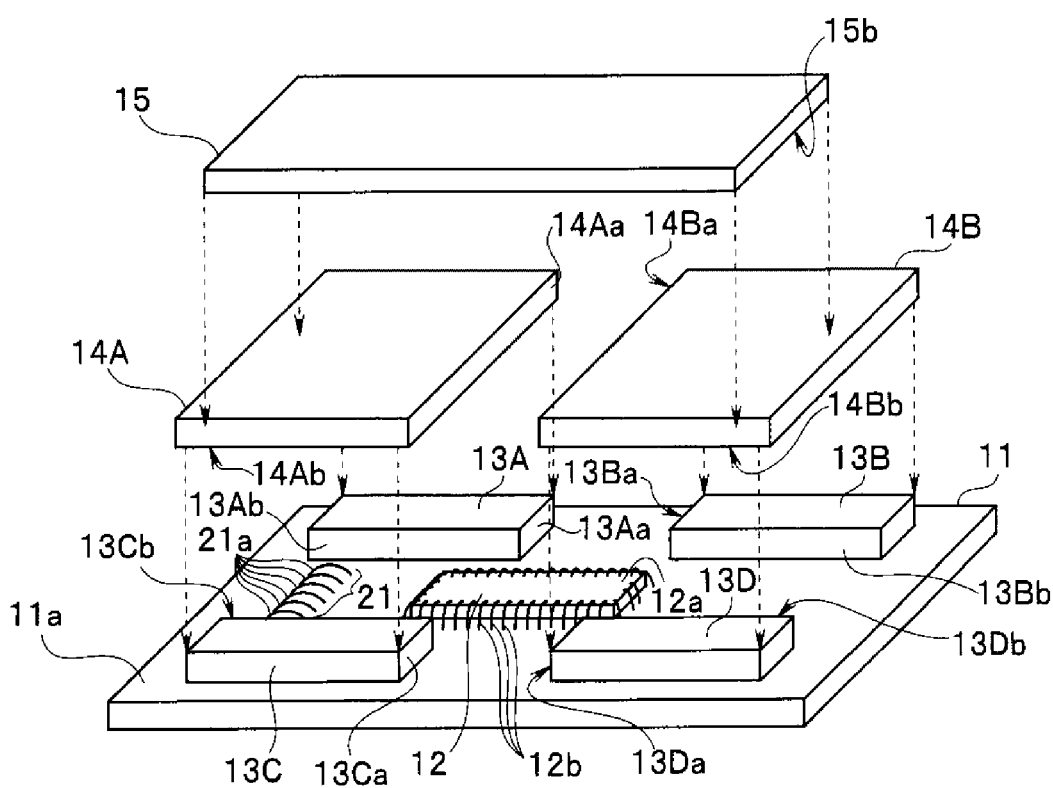
FIG. 2 is an assembly view of the semiconductor device according to the example embodiment.
Figure 3:
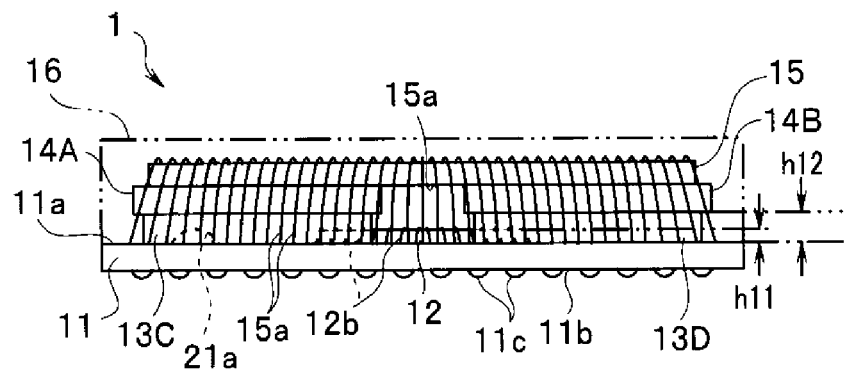
FIG. 3 is a front view of the semiconductor device according to the example embodiment.

FIG. 1 is a plan view of a semiconductor device according to an embodiment. FIG. 2 is an exploded assembly view of the semiconductor device. FIG. 3 is a front view of the semiconductor device. The semiconductor device 1 according to this example embodiment is a packaged semiconductor device including in a resin a substrate, a plurality of semiconductor chips stacked on the substrate, and external terminals electrically connected to the internal semiconductor chips.

The substrate 11 of the semiconductor device 1 is a BGA (Ball Grid Array) package substrate whose upper surface 11a has a rectangular shape. In the particularly illustrated embodiment, the substrate 11 is an interposer made of a glass-epoxy material. The substrate 11 can be connected to electrodes on a circuit board via solder balls 11c on the lower surface 11b of the substrate 11.

The semiconductor chips are themselves each provided in a thin semiconductor package. As such, the back surface of a semiconductor wafer in which a semiconductor circuit has been formed is subjected to a grinding process during manufacture. A DAF (Die Attachment Film) for adhesion to the substrate 11 is on the back surface of the ground thin semiconductor wafer. The semiconductor wafer is diced, together with the DAF, into the individual semiconductor chips.

A semiconductor chip 12 is heated and fixed with the DAF to the upper surface 11a of the substrate 11. Of the plurality of semiconductor chips stacked on the substrate 11, the semiconductor chip 12 is disposed at the lowermost position, and other, generally larger semiconductor chips are placed above the semiconductor chip 12.

When the semiconductor package is used in a mobile phone or the like, substantial restrictions are placed on the final size of the package, especially on the height. Usually in stacking semiconductor chips on a substrate in a conventional design, a larger chip is placed at a lower position and a smaller chip is placed at an upper position. However, when there is a restriction, e.g., on wiring dimensions on the interposer, or when the number of bonding wires must be large and wire bonding is to be performed in three-directions or four-directions from sides of the chip and h the chip size is small (as in the case of a controller chip of a NAND memory), a small semiconductor chip can be placed at a lowermost position and a larger memory chip can be placed at an upper position.

As shown in FIG. 1, a plurality of pads on the upper surface 12a of the semiconductor chip 12 are connected by gold wire bonding process or the like, to a plurality of electrodes provided on the upper surface of the substrate 11 via bonding wires 12b. Accordingly, the semiconductor chip 12 is mounted on the substrate 11 and electrically connected to the substrate 11 via the bonding wires 12b.

In order to ensure a predetermined clearance above the lowermost semiconductor chip 12, a plurality of spacer members are provided on the substrate 11. In particular, four spacer chips 13A, 13B, 13C, 13D are mounted on the upper surface 11a around the semiconductor chip 12 as spacers. These spacer chips 13A, 13B, 13C, 13D can be referred to collectively as spacer chips 13 or when referencing any individual instance when it is unnecessary to specify a particular instance, simply as a spacer chip 13. In the illustrated embodiment the four spacer chips 13A, 13B, 13C, 13D are silicon wafer pieces each having the same size and rectangular shape.

As shown in FIG. 1, the semiconductor chip 12 is disposed in the center of the rectangular substrate 11, and the four spacer chips 13A, 13B, 13C, 13D are respectively disposed at the four corners of the substrate 11. The spacer chips 13A and 13B are arranged along the longitudinal direction D1 of the substrate 11, and the spacer chips 13C and 13D are also arranged along the longitudinal direction D1 of the substrate 11. The spacer chips 13A and 13C are arranged along the lateral direction D2 of the substrate 11, and the spacer chips 13B and 13D are also arranged along the lateral direction D2 of the substrate 11. The spacer chips 13 are adhered and fixed to the substrate 11 with an adhesive such as a DAF.

As shown in FIG. 3, the height h11 from the upper surface 11a to the upper surface 12a is less than the height h12 of each spacer chip 13.

A semiconductor chip 14A is mounted on the spacer chips 13A and 13C. Similarly, a semiconductor chip 14B is mounted on the spacer chips 13B and 13D. As shown in FIG. 1, the semiconductor chips 14A and 14B each have a rectangular shape. The semiconductor chips 14A and 14B are adhered and fixed to the spacer chips 13A, 13C and to the spacer chips 13B, 13D, respectively, with an adhesive such as a DAF.

The semiconductor chip 14A is mounted on the spacer chips 13A and 13C along the lateral direction D2 of the substrate 11 such that the longitudinal direction of the semiconductor chip 14A is parallel to the lateral direction D2 of the substrate 11. Similarly, the semiconductor chip 14B is mounted on the spacer chips 13B and 13D along the lateral direction D2 of the substrate 11 such that the longitudinal direction of the semiconductor chip 14B is parallel to the lateral direction D2 of the substrate 11. Each of the semiconductor chips 14A, 14B is placed on a corresponding pair of spacer chips 13 and is fixed thereto with an adhesive so that the lower surfaces of the longitudinal opposite end portions of each of the semiconductor chips 14A, 14B are supported by the upper surfaces of the corresponding pair of spacer chips 13.

The height h11 of the semiconductor chip 12 is less than the height h12 of each spacer chip 13. Accordingly, the lower surface of each of the semiconductor chips 14A, 14B is not in contact with the semiconductor chip 12 or the bonding wires 12b. In other words, there is a clearance left between the lower surface of each of the semiconductor chips 14A, 14B and the upper surface 12a of the semiconductor chip 12. The spacer chips 13 are mounted on the substrate 11 and around the semiconductor chip 12, and the semiconductor chips 14A, 14B are each mounted on corresponding pairs of spacer chips 13 so that the semiconductor chips 14A, 14B are at a distance from the semiconductor chip 12.

A semiconductor chip 15 is mounted on the semiconductor chips 14A, 14B. As shown in FIG. 1, the semiconductor chip 15 has a rectangular shape. In the illustrated embodiment, the semiconductor chip 15 is disposed to one side (lower side in FIG. 1) of the semiconductor chips 14A, 14B in the longitudinal direction of the semiconductor chips 14A, 14B (the lateral direction D2 of the substrate 11).

The semiconductor chip 15 is mounted on the semiconductor chips 14A, 14B along the longitudinal direction D1 of the substrate 11 such that the longitudinal direction of the semiconductor chip 15 is parallel to the longitudinal direction D1 of the substrate 11. The semiconductor chip 15 is adhered and fixed to the semiconductor chips 14A, 14B with an adhesive such as a DAF. The semiconductor chip 15 is placed on the two semiconductor chips 14 and fixed thereto with an adhesive so that the lower surfaces of the longitudinal opposite ends of the semiconductor chip 15 are supported by the upper surfaces of the two semiconductor chips 14A, 14B. In this example, the semiconductor chip 15 is provided on a plurality of (two in the illustrated embodiment) semiconductor chips (14A, 14B).

The semiconductor chips 14A, 14B are each connected to a plurality of electrodes provided on the upper surface 11a via bonding wires 14a, 14b. The bonding wires 14a, 14b at one end (upper end in FIG. 1) of each of the semiconductor chips 14A, 14B, are connected to the electrodes provided on the upper surface 11a of the substrate 11.

The semiconductor chip 15 is connected to a plurality of electrodes provided on the substrate 11 via bonding wires 15a. The bonding wires 15a at one end (lower end in FIG. 1) of the semiconductor chip 15 are connected to the electrodes provided on the upper surface 11a of the substrate 11.

A resin-resisting section 21 is provided on the substrate 11 between the spacer chips 13A and 13C. The resin-resisting section 21 is a structure that resists the flow of resin during the filling of the resin during packaging, and thereby serves to slow down the resin flow. As shown in FIG. 2, the resin-resisting section 21 is formed of a plurality of bonding wires 21a. As shown in FIG. 2, each bonding wire 21a has an arcuate (arch) shape.

In particular, each bonding wire 21a is formed by a wire bonding machine in such a manner that it connects two points on the upper surface 11a along the longitudinal direction D1 such that it has an arcuate shape whose middle portion lies at some distance above the upper surface 11a. The height of the middle portion of each bonding wire 21a is less than the height h12 of each spacer chip 13. The bonding wires 21a are formed at predetermined intervals along the lateral direction D2 between a side surface 13Ab of the spacer chip 13A and a side surface 13Cb of the spacer chip 13C. The resin-resisting section 21 thus constitutes a projecting section provided between the two adjacent spacer chips 13 of the plurality of spacer chips 13 such that it projects upward from the substrate 11. The projecting section comprises the bonding wires 21a.

After the semiconductor chip 12 is mounted on the substrate 11 and the resin-resisting section 21 is formed on the substrate 11, the semiconductor chips such as the semiconductor chip 14A are mounted. Thereafter, the assembly is subjected to a molding process to encapsulate the semiconductor chips 12, 14, 15 and the spacer chips 13 with a resin. As shown in FIG. 3, a space around the semiconductor chips on the substrate 11 becomes filled with the resin 16 upon the molding.

The filling of the resin is performed by immersing the assembly in the molten liquid resin under vacuum in a mold having a cavity of a predetermined shape. The molten resin covers the semiconductor chip 12, etc. and cures.

Figure 4:
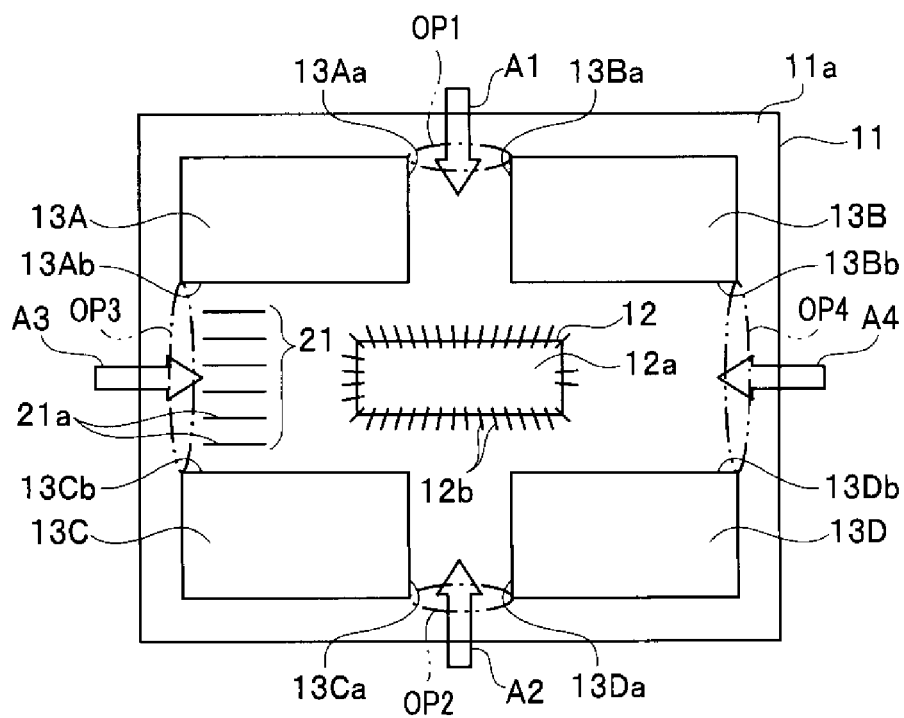
FIG. 4 is a diagram illustrating directions by which a liquid resin enters an assembly including a substrate and semiconductor chips mounted on the substrate, when the assembly is immersed in the liquid resin.

The substrate 11 on which the semiconductor chips 12, etc. are stacked as shown in FIGS. 1 and 3 is immersed in the liquid resin in such a manner that the semiconductor chips 12, etc. lie under the substrate 11 in the direction of gravitational force. FIG. 4 is a diagram illustrating directions in which the liquid resin enters the assembly, including the substrate 11 and the semiconductor chips mounted thereon, when the assembly is immersed in the liquid resin.

Arrow A1 indicates a direction in which the resin enters the space between the spacer chips 13A and 13B. Arrow A2 indicates a direction in which the resin enters the space between the spacer chips 13C and 13D. Arrow A3 indicates a direction in which the resin enters the space between the spacer chips 13A and 13C. Arrow A4 indicates a direction in which the resin enters the space between the spacer chips 13B and 13D. The resin from the direction of arrow A1 passes through an opening OP1 between a side surface 13Aa of the spacer chip 13A and a side surface 13Ba of the spacer chip 13B and flows toward the semiconductor chip 12. The resin from the direction of arrow A1 also enters the assembly through the space between the semiconductor chips 14A and 14B.

The resin from the direction of arrow A2 flows into the assembly through an opening OP2 formed between a side surface 13Ca of the spacer chip 13C and a side surface 13Da of the spacer chip 13D. The resin from the direction of arrow A2 enters the assembly and flows toward the semiconductor chip 12 through the tunnel-like space surrounded and formed by the upper surface 11a of the substrate 11, the lower surface 15b of the semiconductor chip 15, side surfaces 14Aa, 14Ba of the semiconductor chips 14A, 14B, and the side surfaces 13Ca, 13Da of the semiconductor chips 13C, 13D.

The resin from the direction of arrow A3 flows into the assembly through an opening OP3 formed between the side surface 13Ab of the spacer chip 13A and the side surface 13Cb of the spacer chip 13C. The resin from the direction of arrow A3 enters the assembly and flows toward the semiconductor chip 12 through the tunnel-like space surrounded and formed by the upper surface 11a of the substrate 11, the lower surface 14Ab of the semiconductor chip 14A, the side surface 13Ab of the spacer chip 13A, and the side surface 13Cb of the spacer chip 13C.

The resin from the direction of arrow A4 flows into the assembly through an opening OP4 formed between a side surface 13Bb of the spacer chip 13B and a side surface 13Db of the spacer chip 13D. The resin from the direction of arrow A4 enters the assembly and flows toward the semiconductor chip 12 through the tunnel-like space surrounded and formed by the upper surface 11a of the substrate 11, the lower surface 14Bb of the semiconductor chip 14B, the side surface 13Bb of the spacer chip 13B, and the side surface 13Db of the spacer chip 13D. Thus, the plurality of tunnel-like spaces are formed around the semiconductor chip 12, and the resin enters the assembly and flows toward the semiconductor chip 12 through the tunnel-like spaces.

The resin molding process is performed on a large substrate 11 on which a plurality of semiconductor chip sections have been mounted. Each semiconductor chip section has the above-described structure including a stack of the semiconductor chips 12, 14, 15 as shown in FIG. 3. The large substrate 11 is immersed in the liquid resin such that the semiconductor chip sections are positioned under the substrate 11 in the direction of gravitational force (e.g., downward direction with respect to the center of the Earth).

After the resin has cured, the substrate 11 is heated, with a plurality of solder balls placed on the lower surface 11b of the substrate 11 at predetermined positions, whereby the solder balls 11c are attached to the substrate 11. Thereafter, the substrate 11 is diced into substrates each including a semiconductor chip section as described above. Thus, each of the diced substrates corresponds to a single semiconductor device, that is, a semiconductor package as depicted in FIG. 3.

In this example embodiment, the small semiconductor chip 12 is disposed at the bottom of the stacked chips, and the large semiconductor chips 14A, 14B, 15 are disposed above the semiconductor chip 12 with a space/gap therebetween.

The bonding wires 12b are also not uniformly provided surrounding the semiconductor chip 12.

(Operation)

The lowermost semiconductor chip 12 is covered with the resin which is supplied through tunnel-like spaces. In the molding process, the space around the semiconductor chip 12 and all the bonding wires 12b must preferably be filled with the resin without leaving a void.

As shown in FIG. 1, no component or element is present in and on the space between the spacer chips 13A and 13B. Therefore, as depicted in FIG. 4, in the opening OP1 (of the openings OP1, OP2, OP3, OP4 which are indicated in FIG. 4 by the dot-dash line elongated ellipses) through which the resin flows in, the resin also flows in through the space between the semiconductor chips 14A, 14B.

Figure 5:
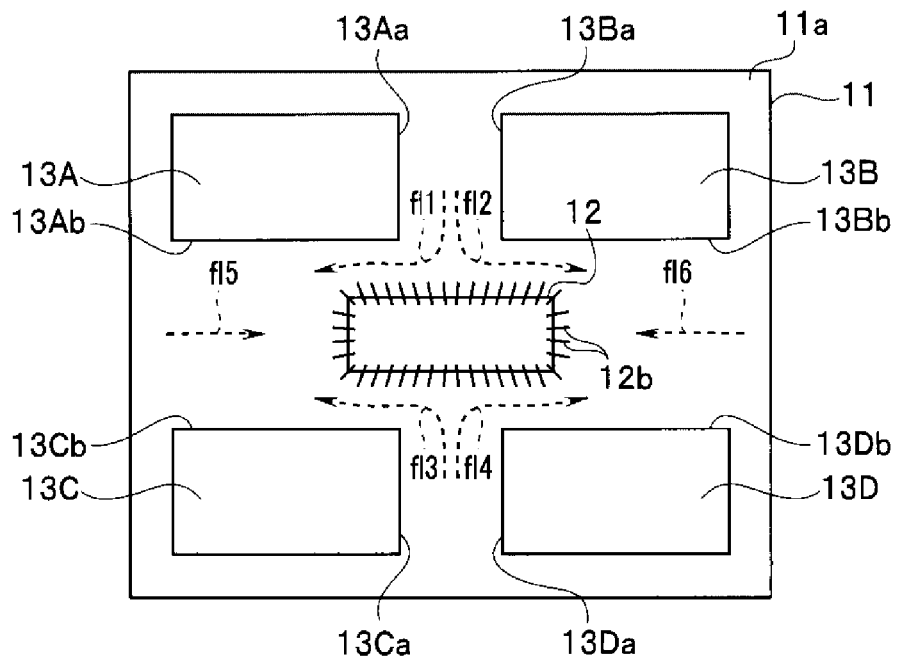
FIG. 5 is a diagram illustrating resin flows according to the example embodiment.
Figure 6:
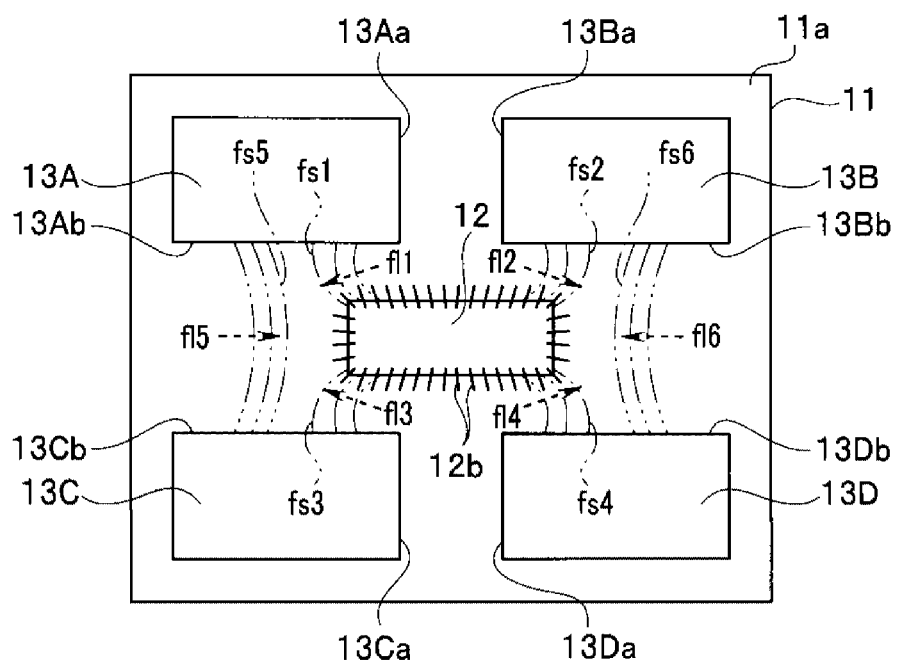
FIG. 6 is a diagram illustrating how fronts of the resin flows move when resin flows into the assembly from the indicated arrow directions.

Flows of the resin will now be described. FIG. 5 is a diagram illustrating aspects of the flows of the resin in packaging. FIGS. 5 and 6 illustrate a case in which the bonding wires 12b are provided around the semiconductor chip 12 uniformly and symmetrically with respect to the longitudinal axis and the lateral axis of the semiconductor chip 12.

The resin flowing in from the direction of arrow A1 (see FIG. 4) hits the side surface of the semiconductor chip 12, and then flows in two directions. The two directions are along the flows f11 and f12 indicated by the dotted-line arrows. The flow f11, which branches from the arrow A1-direction flow, is a flow of the resin toward the space between the side surface 13Ab of the spacer chip 13A and the side surface 13Cb of the spacer chip 13C. The flow f12, which branches from the arrow A1-direction flow, is a flow of the resin toward the space between the side surface 13Bb of the spacer chip 13B and the side surface 13Db of the spacer chip 13D.

The resin from the direction of arrow A2 (see FIG. 4) hits the side surface of the semiconductor chip 12, and then flows in two directions. The two directions are along the flows f13 and f14 indicated by the dotted-line arrows. The flow f13, which branches from the arrow A2-direction flow, is a flow of the resin toward the space between the side surface 13Ab of the spacer chip 13A and the side surface 13Cb of the spacer chip 13C. The flow f14, which branches from the arrow A2-direction flow, is a flow of the resin toward the space between the side surface 13Bb of the spacer chip 13B and the side surface 13Db of the spacer chip 13D.

The flow f15, indicated by the dotted-line arrow, indicates a flow of the resin flowing toward the semiconductor chip 12 in the direction of arrow A3 (see FIG. 4). The flow f16, indicated by the dotted-line arrow, indicates a flow of the resin flowing toward the semiconductor chip 12 in the direction of arrow A4 (see FIG. 4).

Since there is a clearance between the upper surface 12a of the semiconductor chip 12 and each of two lower surface of the semiconductor chips 14A, 14B, the resin from the each direction also enters the space between the upper surface 12a and each of two lower surfaces 14Ab, 14Bb of the semiconductor chips 14A, 14B.

FIG. 6 is a diagram illustrating how the heads (also referred to as "flow fronts" or "fronts") of the resin flows move when the resin flows through the assembly from the arrowed directions (A1-A4). The heads of the resin flows are indicated by the phantom (dash-dot-dot) lines in FIG. 6.

The resin from the direction of arrow A1 passes through the space between the side surface 13Aa of the spacer chip 13A and the side surface 13Ba of the spacer chip 13B, and then passes through the space between the semiconductor chip 12 and the side surface 13Ab of the spacer chip 13A. As shown in FIG. 6, a head fs1 of the resin flow f11 moves in a direction opposite to the direction of arrow A3. Similarly, the resin from the direction of arrow A2 passes through the space between the side surface 13Ca of the spacer chip 13C and the side surface 13Da of the spacer chip 13D, and then passes through the space between the semiconductor chip 12 and the side surface 13Cb of the spacer chip 13C. As shown in FIG. 6, a head fs3 of the resin flow f13 moves in a direction opposite to the direction of arrow A3. A head fs5 of the resin from the direction of arrow A3 moves along the flow f15 direction.

As shown in FIG. 6, a head fs2 of the resin flow f12, a head fs4 of the resin flow f14 and a head fs6 of the resin flow f16 respectively move similarly to the above-described heads fs1, fs3 and fs5.

The heads of the resin flows finally come into contact with each other at a confluence point (also referred to as a "confluence" for simplicity). As a result, the semiconductor chip 12 is completely covered with and encapsulated in the resin in the semiconductor device 1.

However, since the flows f15, f16 are faster than the flows f11, f12, f13, f14, confluences of the heads fs1, fs3 and fs5 and confluences of the heads fs2, fs4 and fs6 may be near a side surface of the semiconductor chip 12.

Figure 7:
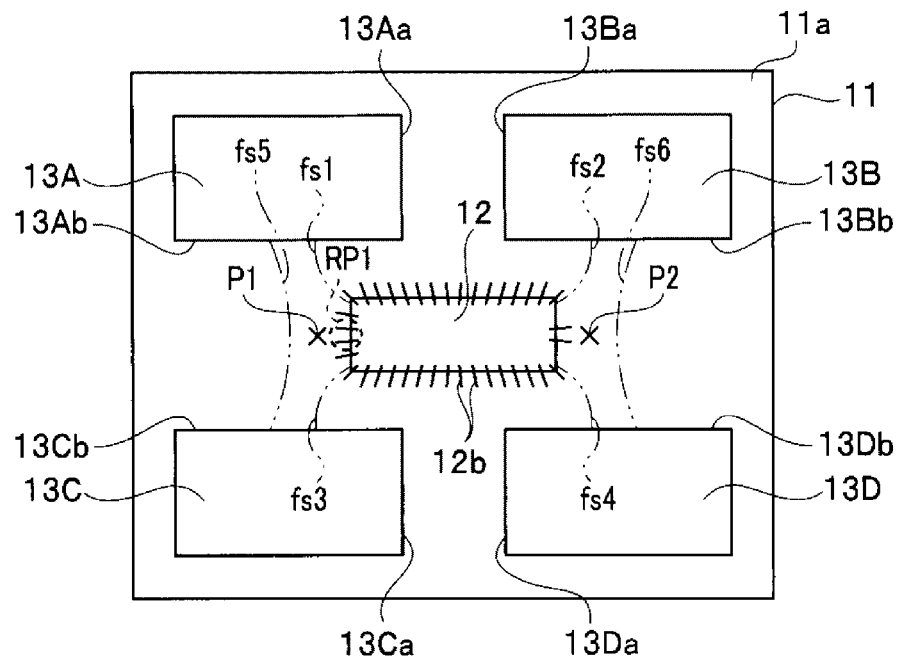
FIG. 7 is a diagram illustrating a position of the confluence of the fronts of the resin flows in the example embodiment.
Figure 8:
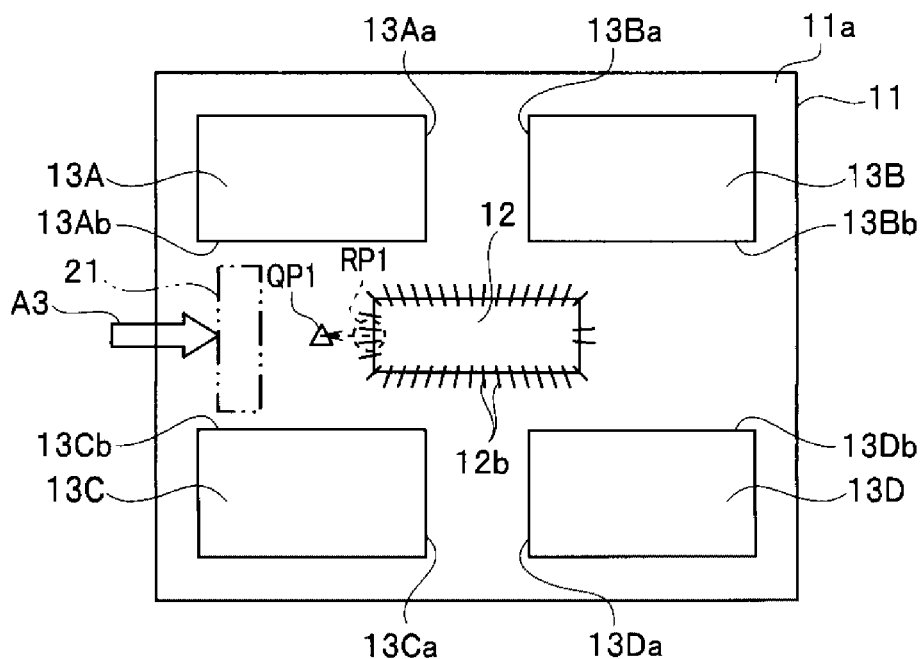
FIG. 8 is a diagram illustrating a position of the confluence of the fronts of the resin flows in the example embodiment.

FIGS. 7 through 10 are diagrams each illustrating a position of the confluence points of the heads of the various resin flows. FIGS. 7 and 8 are diagrams illustrating exemplary positions of the confluence points in the case where the bonding wires 12b are non-uniformly arranged around the semiconductor chip 12 (as shown in FIGS. 1, 2 and 4). In FIGS. 7 and 8, the number of the arrow A4-side bonding wires 12b is fewer than the number of the arrow A3-side bonding wires 12b.

Figure 9:
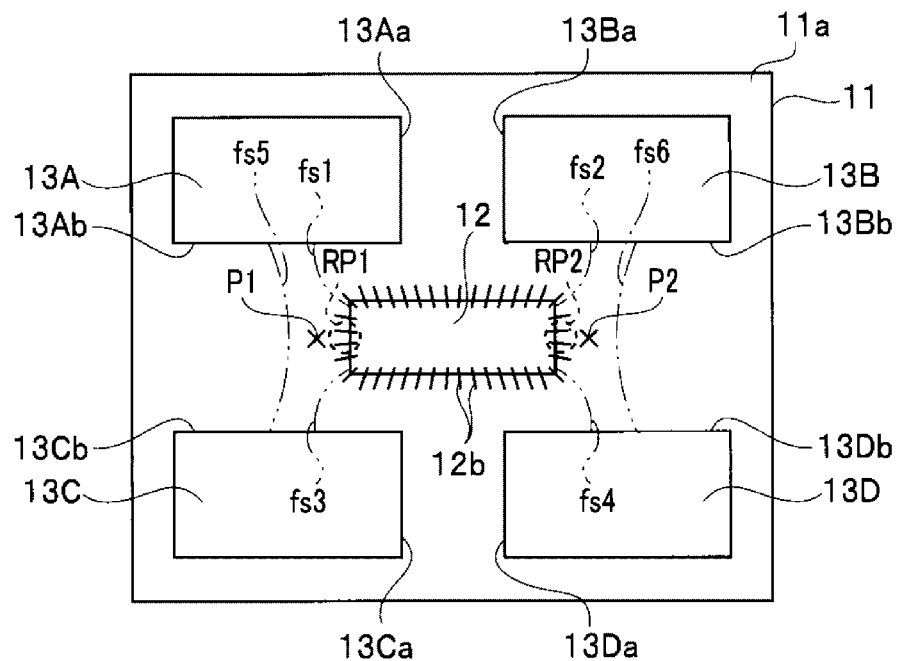
FIG. 9 is a diagram illustrating a position of the confluence of the fronts of the resin flows in the example embodiment.
Figure 10:
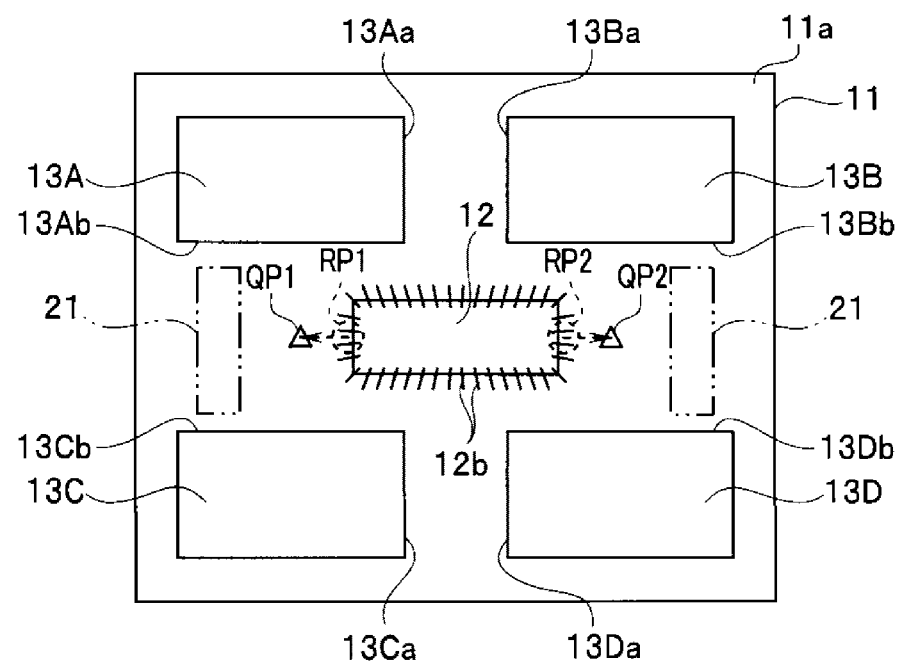
FIG. 10 is a diagram illustrating a position of the confluence of the fronts of the resin flows in the example embodiment.

FIGS. 9 and 10 are diagrams illustrating exemplary positions of the confluence points in the case where the bonding wires 12b are uniformly arranged around the semiconductor chip 12 (as shown in FIGS. 5 and 6). Each confluence is predicted or estimated by, for example, an experiment or a simulation and is based on the length of the tunnel-like space through which the resin enters, and other flow-related parameters.

In FIG. 7, the resin-resisting section 21 has not been formed on the substrate 11. In FIG. 7, a predicted confluence (P1) of the heads fs1, fs3 and fs5 and a predicted confluence (P2) of the heads fs2, fs4 and fs6 are each indicated by the a respectively labelled mark "X". However, in an assembly as actually manufactured, the confluence may be located not at the position P1 but rather at the position RP1, indicated by a dashed circular mark, due to the influence of the bonding wires 12b of the semiconductor chip 12. In that case, the bonding wires 12b may impede movement of the resin, resulting in the formation of microvoid(s) at or in the vicinity of the actual confluence RP1.

This is because the number of bonding wires 12b on one side (left side in FIG. 7) of the semiconductor chip 12 in the longitudinal direction is greater than the number of bonding wires 12b on the other side (right side in FIG. 7) of the semiconductor chip 12 in the longitudinal direction. This leads to a shift of the confluence to the position RP1 closer to the bonding wires 12b on one side (left side in FIG. 7) of the semiconductor chip 12 in the longitudinal direction. A microvoid is likely to be formed at or in the vicinity of the confluence RP1.

On the other hand, the number of bonding wires 12b on the other side (right side in FIG. 7) of the semiconductor chip 12 in the longitudinal direction is fewer than the number of bonding wires 12b on the one side (left side in FIG. 7) of the semiconductor chip 12 in the longitudinal direction. Therefore, the confluence of the heads fs2, fs4 and fs6 is located not at a position close to the bonding wires 12b on the other side (right side in FIG. 7) of the semiconductor chip 12 in the longitudinal direction, but rather at the position P2 at some distance away from the bonding wires 12b. A microvoid would be less likely to be formed in the vicinity of the confluence P2.

In view of the above, as depicted in FIG. 8, the resin-resisting section 21 (shown in FIGS. 1 through 4) is provided on the substrate 11. The resin-resisting section 21 is provided at a position nearer to the opening OP3 than the confluence RP1. The resin-resisting section 21 effectively reduces the size of the tunnel-like space through which the resin flows in from the direction of arrow A3. In FIG. 8, a predicted confluence QP1 of the heads fs1, fs3 and fs5 is indicated by a triangular mark. The resin-resisting section 21 slows down the resin flowing in from the opening OP3, thereby shifting the confluence RP1 away from the side surface of the semiconductor chip 12 toward the periphery of the substrate 11. Thus, the confluence of the heads fs1, fs3 and fs5 shifts from the position RP1 in FIG. 7 to the position QP1 of FIG. 8. A microvoid is less likely to be formed at or in the vicinity of the confluence QP1 than at the position RP1.

Thus, by reducing the size of the tunnel-like space into which the resin flows from the direction of arrow A3, the speed of the resin flow from the direction of arrow A3 more closely matches the speed of the resin flow from the direction of arrow A4 during the molding of the resin. This shifts the confluence from the position RP1 to the position QP1, resulting in less microvoid formation.

In the case of FIG. 9, the resin-resisting section 21 is not provided on the substrate 11. In FIG. 9, the predicted confluence P1 of the heads fs1, fs3 and fs5 and the predicted confluence P2 of the heads fs2, fs4 and fs6 are indicated by the respectively labeled mark "X". However, in an actual assembly, the first confluence may be located not at the position P1 but rather at the position RP1, indicated by a dashed circular mark, and the second confluence may be located not at the position P2 but rather at the position RP2, indicated by a dashed circular mark, because of the influence of the bonding wires 12b of the semiconductor chip 12. In that case, the bonding wires 12b may impede the flow of the resin, resulting in the formation of a microvoid(s) at or in the vicinity of the confluences RP1, RP2.

In FIGS. 9 and 10, the number of bonding wires 12b on one side (left side in FIG. 7) of the semiconductor chip 12 in the longitudinal direction is equal to the number of bonding wires 12b on the other side (right side in FIG. 7) of the semiconductor chip 12 in the longitudinal direction. As shown in FIG. 9, this leads to a shift of the confluences to the positions RP1, RP2 closer to the bonding wires 12b on both sides (left and right sides in FIG. 7) of the semiconductor chip 12 in the longitudinal direction. A microvoid(s) more likely to be formed at or in the vicinity of the confluences RP1, RP2.

In view of the above, as depicted in FIG. 10, two resin-resisting sections 21 are provided on the substrate 11. The resin-resisting sections 21 are provided at a position nearer to the opening OP3 than the confluence RP1 and at a position nearer to the opening OP4 than the confluence RP2. In FIG. 10, the predicted confluence QP1 of the heads fs1, fs3 and fs5 and the predicted confluence QP2 of the heads fs2, fs4 and fs6 are each respectively indicated by a triangular mark. The two resin-resisting sections 21 slow down the resin flowing in from the opening OP3 and the resin flowing in from the opening OP4, thereby shifting the confluences RP1, RP2 away from the side surfaces of the semiconductor chip 12 toward the periphery of the substrate 11. Thus, the confluence of the heads fs1, fs3 and fs5 shifts from the position RP1 of FIG. 9 to the position QP1 of FIG. 10, and the confluence of the heads fs2, fs4 and fs6 shifts from the position RP2 of FIG. 9 to the position QP2 of FIG. 10. A microvoid(s) is less likely to be formed at or in the vicinity of the confluences QP1 and QP2 than at the positions RP1 and RP2.

Thus, by reducing the sizes of the two tunnel-like spaces into which the resin flows from the direction of arrow A3 and from the direction of arrow A4, the speed of the resin flow from the direction of arrow A3 and the speed of the resin flow from the direction of arrow A4 during molding of the resin are reduced. This shifts the first confluence from the position RP1 to the position QP1 and shifts the second confluence from the position RP2 to the position QP2, resulting in less microvoid formation.

In general, the resin has hygroscopic properties. When a semiconductor device, having in an encapsulating resin in which microvoid which has been left by a failure of complete filling by the resin, begins to take up moisture after completion of packaging and/or shipping of the device, water (humidity) may begin to collect in any microvoid left in the package, and the semiconductor device may thus break when the accumulated water expands/vaporizes with heating during a high-temperature reflow process or the like. It is, therefore, preferable to produce semiconductor packages without a void in it. According to this example embodiment, a microvoid is less likely to be formed in the semiconductor package, thus making it possible to better prevent breakage of the semiconductor package upon a high-temperature process of a package which has taken up moisture.

As described hereinabove, an example embodiment makes it possible to provide a semiconductor device which is less likely to have a void in the encapsulating resin due to insufficient filling of the resin.

In particular, the resin-resisting section(s) 21 adjusts the resistance resin flows in the tunnel-like space(s) left around the lowermost semiconductor chip 12 so as to slow down an incoming resin flow from each opening and/or to better match the speed of another resin flow from another opening. This can shift the position of the confluence points of the various resin flows, thereby helping in preventing the formation of microvoid(s).

In the above-described example embodiment, each resin-resisting section 21 is composed of a plurality of bonding wires 21a. However, in one possible variation, it is possible to use a resin-resisting section that is composed of a solder resist (solder mask) or a potting resin. A potting resin herein refers to a resin used in so-called a potting process.

Figure 11:
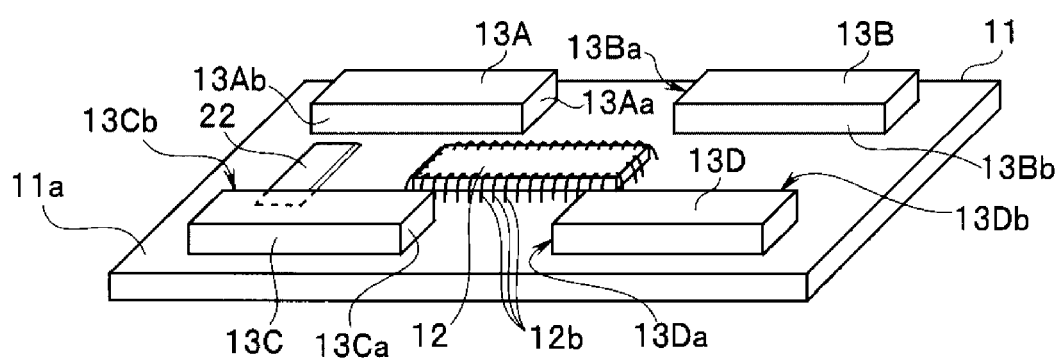
FIG. 11 is a perspective view of a substrate which has a resin-resisting section composed of a solder resist according to a variation of the example embodiment.

FIG. 11 is a perspective view of the substrate 11 having a resin-resisting section composed of a solder. As shown in FIG. 11, a solder resist section 22, having a rectangular shape and projecting from the upper surface 11a of the substrate 11, is provided as a resin-resisting section in substantially the same position as that of the resin-resisting section 21 depicted in FIG. 2. Thus, the solder resist section 22 constitutes a projecting section comprising a solder resist, provided on the substrate 11.

In this example, the resin-resisting section is formed by locally thickening a solder resist when it is applied it to the upper surface 11a of the substrate 11 during manufacturing of the substrate 11. The solder resist section 22 reduces the size of the tunnel-like space into which the resin flows from the direction of arrow A3 during molding. This makes it possible to make the speed of the resin flow from the direction of arrow A3 match the speed of the resin flow from the direction of arrow A4.

Figure 12:
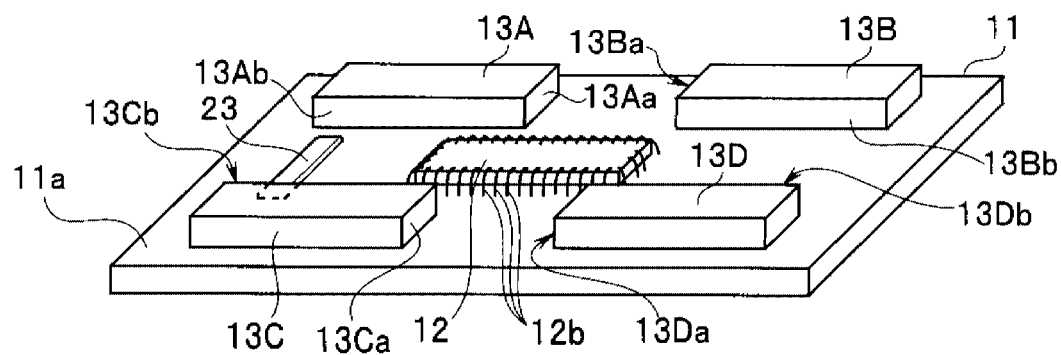
FIG. 12 is a perspective view of a substrate which has resin-resisting section composed of a potting resin according to another variation of the example embodiment.

FIG. 12 is a perspective view of the substrate 11 having a resin-resisting section composed of a potting resin. As shown in FIG. 12, a potting resin section 23, produced by potting a resin of a predetermined thickness, is provided as a resin-resisting section on the upper surface 11a of the substrate 11 in substantially the same position as that of the resin-resisting section 21 depicted in FIG. 2. The potting resin section 23 constitutes a projecting section formed of a potting resin, provided on the substrate 11.

It is also possible to use as a resin-resisting section any combination of bonding wires 21a, a solder resist section 22, and a potting resin section 23.

The potting resin section 23 is formed by forming a raised portion of resin, having a predetermined thickness, by potting on the upper surface 11a of the substrate 11 after mounting the semiconductor chip 12 on the upper surface 11a. The potting resin section 23 reduces the size of the tunnel-like space into which the resin flows from the direction of arrow A3 during molding. This makes it possible to make the speed of the resin flow from the direction of arrow A3 match the speed of the resin flow from the direction of arrow A4.

As described hereinabove, according to embodiments and variations, it becomes possible to provide a semiconductor device which is less likely to have a void in its encapsulating resin.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor device, comprising:
   a first pair of spacers on a surface of a substrate, the spacers of the first pair having a first height and spaced from each other by a first distance along a first direction;
   a first semiconductor chip on the surface between the first pair of spacers in the first direction, the first semiconductor chip having a second height less than the first height and connected to the substrate with a plurality of bonding wires;
   a second semiconductor chip mounted on the first pair of spacers and spanning the first distance, the second semiconductor chip being above the first semiconductor chip; and
   a projecting section on the surface of the substrate between the first pair of spacers in the first direction, the projecting section being between the first semiconductor chip and an outer edge of the substrate and protruding upward from the surface to a third height.

2. The semiconductor device according to claim 1, wherein the projecting section comprises a plurality of bonding wires spanning between different points on the surface of the substrate.

3. The semiconductor device according to claim 2, wherein each bonding wire in the projecting section extends substantially parallel to the second direction.

4. The semiconductor device according claim 1, wherein the projecting section comprises a solder resist.

5. The semiconductor device according to claim 1, wherein the projecting section comprises a potting resin.

6. The semiconductor device according to claim 1, further comprising:
   a packaging resin encapsulating the first semiconductor chip, the first pair of spacers, and the second semiconductor chip.

7. The semiconductor device according to claim 1, wherein the third height is less than the first height.

8. The semiconductor device according to claim 1, wherein the third height is less than or equal to the second height.

9. The semiconductor device according to claim 1, wherein the substrate is a ball grid array package substrate.

10. The semiconductor device according to claim 1, further comprising:
    a second pair of spacers mounted on the substrate, wherein
    the spacers of the second pair have the first height,
    at least a portion of the first semiconductor chip is between the spacers of the second pair in the first direction, and
    the first pair of spacers is spaced from the second pair of spacers on the substrate in a second direction crossing the first direction.

11. The semiconductor device according to claim 10, further comprising:
    a third semiconductor chip mounted on the second pair of spacers and spanning a distance between the spacers of the second pair, the third semiconductor chip being above the first semiconductor chip.

12. The semiconductor device according to claim 11, further comprising:
    another projecting section on the surface of the substrate between the second pair of spacers in the first direction and between the first semiconductor chip and the outer edge of the substrate and protruding upward from the surface to the third height.

13. A semiconductor device, comprising:
    a substrate having a first surface;
    a first semiconductor chip mounted to the first surface of the substrate and connected to the substrate by a first plurality of bonding wires;
    a plurality of spacer chips mounted on the first surface of the substrate, each spacer chip in the plurality being between the first semiconductor chip and an outer edge of the substrate, each spacer chip being spaced from other spacer chip;
    a second semiconductor chip mounted on a first pair of spacer chips in the plurality of spacer chips, the first pair being spaced from each other in a first direction; and
    a projecting portion on the first surface of the substrate between the first pair of spacers in the first direction, the projecting portion being between the first plurality of bonding wires and the outer edge of the substrate in a second direction orthogonal to the first direction, the projecting portion protruding upward from the first surface of the substrate, wherein
    the first semiconductor chip extends from the first surface to a first height, and
    each spacer chip in the plurality extends from the first surface to a second height that is greater than the first height.

14. The semiconductor device according to claim 13, further comprising:
    a third semiconductor chip mounted on a second pair of spacer chips in the plurality of spacer chips, the second pair being spaced from each other in the first direction, and spaced from the first pair in the second direction.

15. The semiconductor device according to claim 14, further comprising:
    another projecting portion on the first surface of the substrate between the second pair of spacers in the first direction.

16. The semiconductor device according to claim 13, wherein the projecting portion comprises a second plurality of bonding wires, each bonding wire in the second plurality being connected to two different points on the first surface of the substrate and spanning between the two different points on the first surface of the substrate.

17. The semiconductor device according to claim 13, wherein the projecting portion comprises a solder resist.

18. The semiconductor device according to claim 13, wherein the projecting portion comprises a potting resin.

19. A semiconductor device, comprising:
    a planar substrate having a first surface;
    a first semiconductor chip mounted on the first surface and connected to the planar substrate by a first plurality of bonding wires, the first semiconductor chip having a substantially rectangular planar shape, the first semiconductor chip extending to a first height above the first surface in a first direction;
    a first spacer chip mounted on the first surface of the substrate between a first corner of the first semiconductor chip and an outer edge of the planar substrate;

a second spacer chip mounted on the first surface of the substrate between a second corner of the first semiconductor chip and the outer edge of the planar substrate, the second spacer chip being spaced from the first spacer chip in a second direction along the first surface;

a second semiconductor chip mounted on the first spacer chip and the second spacer chip, the second semiconductor chip spanning extending in the second direction from the first spacer chip to the second spacer chip while leaving a gap between a lower surface of the second semiconductor chip and the first surface of the substrate in the first direction; and a projecting section on the first surface of the substrate between the first and second spacers chips in the second direction, the projecting section being between the first plurality of bonding wires and the outer edge of the substrate in a third direction along the first surface crossing the second direction, the projecting section being disposed in the gap between the lower surface of second semiconductor chip and the first surface of the substrate.

20. The semiconductor device according to claim 19, wherein the projecting section is formed of at least one of bonding wires, solder resist, and potting resin.

21. A method of forming a semiconductor device, comprising:

forming a first pair of spacers on a surface of substrate, the spacers of the first pair having a first height and being spaced from each other by a first distance along a first direction;

placing a first semiconductor chip on the surface of the substrate;

connecting the first semiconductor chip to the surface of the substrate with a first plurality of bonding wires;

mounting a second semiconductor chip on the first pair of spacers, the second semiconductor chip spanning the first distance and being above the first semiconductor chip; and forming a projecting section on the surface of the substrate between the first pair of spacers in the first direction, the projecting section being between the first plurality of bonding wires and an outer edge of the substrate and protruding upward from the surface.

* * * * *